(12) United States Patent
Liao et al.

(10) Patent No.: US 8,149,627 B2
(45) Date of Patent: Apr. 3, 2012

(54) CURRENT SINK SYSTEM BASED ON SAMPLE AND HOLD FOR SOURCE SIDE SENSING

(75) Inventors: Kuo-Yu Liao, Hsinchu (TW); Han-Sung Chen, Hsinchu (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 290 days.

(21) Appl. No.: 12/716,028

(22) Filed: Mar. 2, 2010

(65) Prior Publication Data

US 2011/0216601 A1 Sep. 8, 2011

(51) Int. Cl.
*G11C 16/06* (2006.01)
(52) U.S. Cl. .......... 365/185.21; 365/207; 365/210.1
(58) Field of Classification Search ........... 365/185.21, 365/185.22, 189.09, 189.15, 189.16, 207, 365/210.1
See application file for complete search history.

(56) References Cited

U.S. PATENT DOCUMENTS

| | | | |
|---|---|---|---|
| 5,914,638 A | 6/1999 | He | |
| 6,191,989 B1 * | 2/2001 | Luk et al. | 365/207 |
| 6,272,043 B1 | 8/2001 | Hollmer | |
| 6,731,542 B1 | 5/2004 | Le et al. | |
| 6,771,543 B2 | 8/2004 | Wong et al. | |
| 6,852,966 B1 * | 2/2005 | Douma et al. | 250/214 AG |
| 6,950,342 B2 * | 9/2005 | Lindhorst et al. | 365/185.21 |
| 7,082,058 B2 * | 7/2006 | Lee et al. | 365/185.21 |
| 7,236,415 B2 | 6/2007 | Forbes et al. | |
| 7,295,471 B2 | 11/2007 | Hsieh et al. | |
| 7,339,846 B2 | 3/2008 | Lin et al. | |
| 7,701,785 B2 * | 4/2010 | Sanjeevarao et al. | 365/189.09 |
| 7,957,206 B2 * | 6/2011 | Bauser | 365/189.15 |
| 8,064,263 B2 * | 11/2011 | Hung et al. | 365/185.21 |
| 2006/0050582 A1 | 3/2006 | Perner | |
| 2008/0129377 A1 | 6/2008 | You et al. | |
| 2011/0085384 A1 * | 4/2011 | Chen et al. | 365/185.21 |

* cited by examiner

*Primary Examiner* — Gene Auduong
(74) *Attorney, Agent, or Firm* — Haynes Beffel & Wolfeld LLP

(57) ABSTRACT

Source-side sensing techniques described herein determine the data value stored in a memory cell based on the difference in current between the read current from the source terminal of the memory cell and a sink current drawn from the read current. The sink current is drawn in response to a magnitude of an operating voltage between first and second nodes. During a first time interval, the operating voltage is set in response to a magnitude of the reference current using a feedback path. During a second time interval following the first time interval, the operating voltage is held independent of the feedback path. The data value stored in the memory cell is determined based on a difference in current between the read current and the sink current during the second time interval.

20 Claims, 9 Drawing Sheets

CURRENT SINK SYSTEM BASED ON SAMPLE AND HOLD FOR SOURCE SIDE SENSING

REFERENCE TO RELATED APPLICATIONS

This application is related to U.S. patent application Ser. No. 12/576,466, filed 9 Oct. 2009, entitled "Current Sink System for Source Side Sensing," which is incorporated by reference as if fully set forth herein.

BACKGROUND OF THE INVENTION

1. Field of the Invention

The present invention relates to sensing data in memory devices, and more particularly to preventing disturbance of sensing operations in memory devices due to noise.

2. Description of Related Art

There are a variety of types of non-volatile memory based on charge storage memory cells, including memory cells that store charge between the channel and gate of a field effect transistor. The amount of charge stored affects the threshold voltage of the transistor, which can be sensed to indicate data.

One type of charge storage memory cell is known as a floating gate memory cell. In a floating gate memory cell, charge is stored on an electrically conductive layer between the channel and gate of the transistor. The threshold voltage is changed by adding or removing charge on the electrically conductive layer by applying appropriate voltages to the memory cell. Another type of memory cell is referred to as a charge trapping memory cell, which uses a dielectric charge trapping layer in place of the floating gate.

In a read or sense operation of a data value stored in a memory cell, appropriate voltages are applied to induce a current to flow from the drain terminal to the source terminal of the memory cell. The current is dependent upon the threshold voltage of the memory cell, and thus is indicative of the data value stored therein.

Determining the data value stored in the memory cell can be carried out using a sense amplifier which senses the current through the memory cell, and compares the sensed current to a suitable reference or references. FIG. 1 illustrates a prior art implementation of a sense amplifier 170 used for sensing a data value stored in a selected memory cell 110.

Memory cell 110 is representative of memory cells in a memory array which may include millions or billions of memory cells. Word line 120 is coupled to the gate terminal of the memory cell 110. Bit lines 130, 132 are coupled to the source and drain terminals 112, 114 of the memory cell 110. Column select transistor 140 is responsive to an SEL signal to selectively couple the bit line 130 to a data line 150 connected to a sensing input 172 of sense amplifier 170.

In a sense operation of the memory cell 110, appropriate voltages are applied to word line 120 and bit line 132 to induce a read current $I_{CELL}$ from the drain terminal 114 to the source terminal 112 and onto the bit line 130. The read current $I_{CELL}$ is provided to the data line 150 via the column select transistor 140. The read current $I_{CELL}$ charges an equivalent load capacitor $C_{LOAD1}$ at the sensing input 172 of the sense amplifier 170, causing the voltage on the sensing input 172 to change by an amount proportional to the read current $I_{CELL}$ over the duration of the sense operation. The magnitude of the read current $I_{CELL}$ depends on the threshold voltage of the memory cell 110, with a lower threshold voltage resulting in a higher current. Thus, the voltage at the sensing input 172 will change more rapidly if the memory cell 110 is in a lower threshold state than if the memory cell 110 is in a higher threshold state.

A reference is used to provide a reference current $I_{REF}$ to a reference input 174 of the sense amplifier 170 during the sense operation. In this example, the reference current $I_{REF}$ is provided using a reference cell 210.

A word line 220 is coupled to the gate terminal of the reference cell 210. Bit lines 230, 232 are coupled to the source and drain terminals 212, 214 of the reference cell 210. Column select transistor 142 selectively couples the bit line 230 to a reference line 160 connected to the reference input 174 of the sense amplifier.

Appropriate voltages are applied to the word line 220 and the bit line 232 to induce a reference current $I_{REF}$ from the drain terminal 214 to the source terminal 212 and onto the bit line 230. The reference current $I_{REF}$ is provided to the reference line 160 via column select transistor 142. The reference current $I_{REF}$ charges an equivalent load capacitor $C_{LOAD2}$ at the reference input 174 of the sense amplifier 170, converting the reference current $I_{REF}$ to a reference voltage on the reference input 174.

The sense amplifier 170 is activated by a sense enable signal SEN during the sense operation. The sense amplifier 170 is responsive to the difference between the voltage on the sensing input 172 and the voltage on the reference input 174 to generate an output signal 176 indicating the data value stored in the selected memory cell 110.

FIG. 2 is a simplified illustration of the change in voltage on the sensing input 172 and the reference input 174 during the sensing operation. Curve 250 illustrates the change in voltage at the sensing input 172 if the selected memory cell 110 is in the low threshold state. Curve 260 illustrates the change in voltage at the sensing input 172 if the selected memory cell 110 is in the high threshold state. The difference between the curves 250 and 260 at time $T_1$ is a sensing margin used to distinguish the low threshold state from the high threshold state. In order to reliably distinguish between the high and low threshold states, it is important to maintain a relatively large sensing margin. In multiple-bit-per-cell embodiments, there are more than two threshold states, with sensing margins between them.

Curve 270 illustrates the change in voltage on the reference input 174 during the sensing operation. In this example, at time T1 curve 270 has a voltage between the low threshold state curve 250 and the high threshold state curve 260. This can be achieved, for example, by setting the threshold voltage of the reference cell 210 between the lower and higher threshold states of the memory cell 110, so that the reference current $I_{REF}$ has a magnitude between the read current $I_{CELL}$ of the memory cell 110 in the high threshold state and the low threshold state. As another example, this can be achieved by applying different voltages to the word lines 120 and 220, and/or applying different voltages to the bit lines 132 and 232.

The sense amplifier 170 generates an output signal 176 having a value dependent upon whether the voltage on the sensing input 172 is above or below the voltage on the reference input 174 at time T1, thereby indicating the data value stored in the memory cell 110.

An issue which arises during the sensing operation is the susceptibility of the sense amplifier 170 to noise. Specifically, noise occurring during the sensing operation can affect the difference between the voltages on the sensing input 172 and the reference input 174, which increases complexity of the sense amplifier 170 or the time needed for sensing.

In the implementation illustrated in FIG. 1, memory cell 110 is isolated from the reference cell 210, and the read current $I_{CELL}$ and the reference current $I_{REF}$ are not dependent upon one another. Consequently, the memory cell 110 can be exposed to noise different from that of the reference cell 210, which can cause disproportionate changes in the read current $I_{CELL}$ and the reference current $I_{REF}$. This results in a wide variation in the voltage differential between the sensing input 172 and the reference input 174, which inhibits the sense amplifier 170 from accurately sensing the data value stored in the memory cell 110.

In the above described implementation, the sensing input 172 of the sense amplifier is coupled to the source terminal 112 of the memory cell 110 ("source-side sensing"). As a result, the voltage on the source terminal 112 will also increase by an amount dependent upon the read current $I_{CELL}$. The increase in voltage on the source terminal decreases the drain-to-source voltage and increases the body effect of the memory cell 110. This in turn reduces the read current $I_{CELL}$ provided by the memory cell 110.

The threshold voltages of memory cells in an array will vary because of variations in the operating environment, as well as in materials and manufacturing processes. These variations result in differences in read current among memory cells storing the same data value, including differences in the change in read current caused by an increase in the source voltage. Thus, having the source voltage increase by an amount dependent upon the read current results in a wide distribution of the voltage or current at the sensing input 172 of the sense amplifier 170, which increases the complexity of the sense circuitry or the time needed for sensing. Source-side sensing circuitry and methods for operating addressing issues caused by the variation in source voltage have been proposed in U.S. patent application Ser. No. 12/576,466.

It is therefore desirable to provide sense circuitry and methods for operating such circuitry having low susceptibility to noise and addressing the issues caused by the variation in source voltage.

SUMMARY OF THE INVENTION

Source-side sensing techniques described herein determine the data value stored in a memory cell based on the difference in current between the read current from the source terminal of the memory cell and a sink current drawn from the read current. The sink current is drawn in response to a magnitude of an operating voltage between first and second nodes. During a first time interval, the operating voltage is set in response to a magnitude of the reference current using a feedback path which quickly establishes the operating voltage between the first and second nodes. During a second time interval following the first time interval, the feedback path is disabled and the operating voltage is held by a capacitor which maintains the operating voltage essentially constant during the second time interval. As a result, noise injected into one of the first and second nodes will cause similar changes in the other of the first and second nodes, so that the operating voltage remains essentially constant during the second time interval and thus noise free. The data value stored in the memory cell is determined based on a difference in current between the read current and the sink current during the second time interval. Accordingly, the accuracy of the difference is substantially unaffected by the presence of noise at the first and second nodes.

Using the difference between the read current and the sink current, rather than the entire read current, reduces the amount of voltage variations at the source terminal of the memory cell during the sensing operation. This in turn reduces the variation in the read current among cells in the array during source-side sensing. As a result, the distribution in the voltage or current on the sensing node among memory cells in the array will be tightened.

A memory device as described herein includes a memory array arranged to provide a read current from a selected memory cell in the array to a data line. A reference current source is arranged to provide a reference current. Current sink circuitry is coupled to the data line, and arranged to draw a sink current from the data line in response to a magnitude of an operating voltage between first and second nodes. The current sink circuitry includes a feedback path operable to set the operating voltage between the first and second nodes in response to a magnitude of the reference current. A capacitor is coupled between the first and second nodes for holding the operating voltage. A switch is operable to enable the feedback path during the first time interval, and to disable the feedback path during a second time interval following the first time interval. Sense amplifier circuitry is coupled to the data line. The sense amplifier circuitry is responsive to a difference in current between the read current and the sink current during the second time interval to generate an output signal indicating a data value stored in the selected memory cell.

A sensing method for a memory cell as described herein includes applying a bias to the memory cell to induce a read current from the memory cell to a data line. A reference current is provided from a reference current source. A sink current is drawn from the data line in response to a magnitude of an operating voltage between the first and second nodes. Drawing the sink current includes setting the operating voltage between the first and second nodes in response to a magnitude of the reference current during a first time interval using a feedback path, and holding the operating voltage between the first and second nodes independent of the feedback path during a second time interval following the first time interval. The data value stored in the memory cell is determined based on a difference in current between the read current and the sink current during the second time interval.

Other aspects and advantages of the present invention can be seen on review of the drawings, the detailed description, and the claims which follow.

DETAILED DESCRIPTION

A detailed description of embodiments of the present invention is provided with reference to the FIGS. 3-9.

Figure 1:
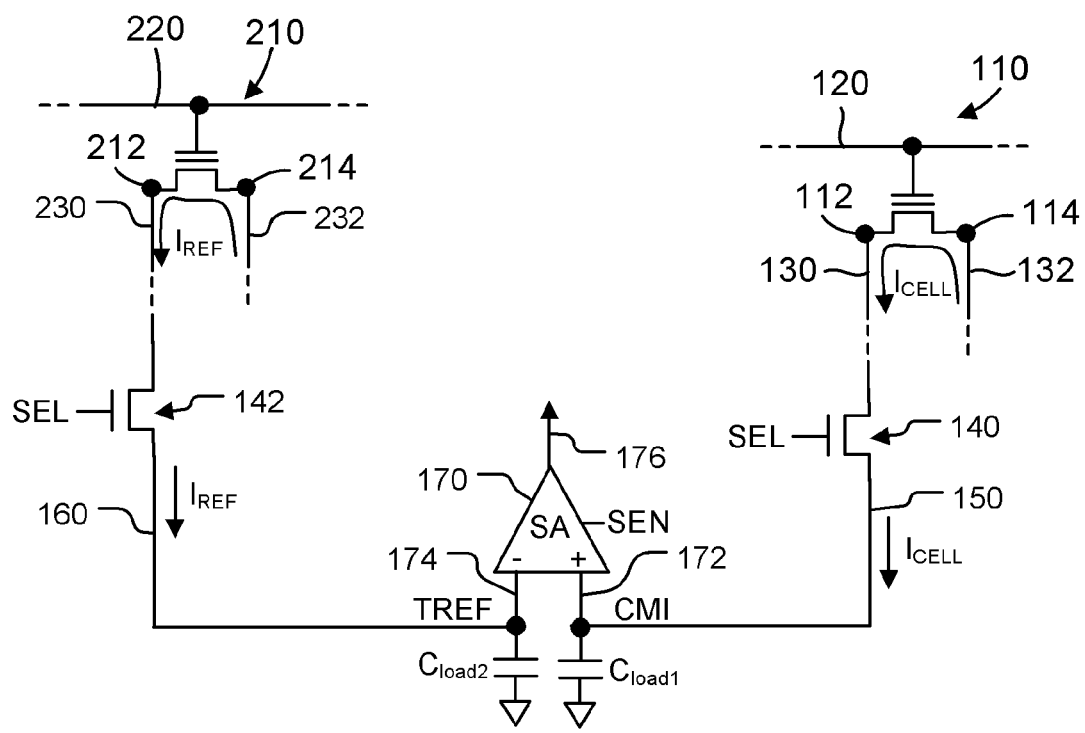
FIG. 1 is a schematic diagram of a prior art memory device implementing a source side sensing scheme.
Figure 2:
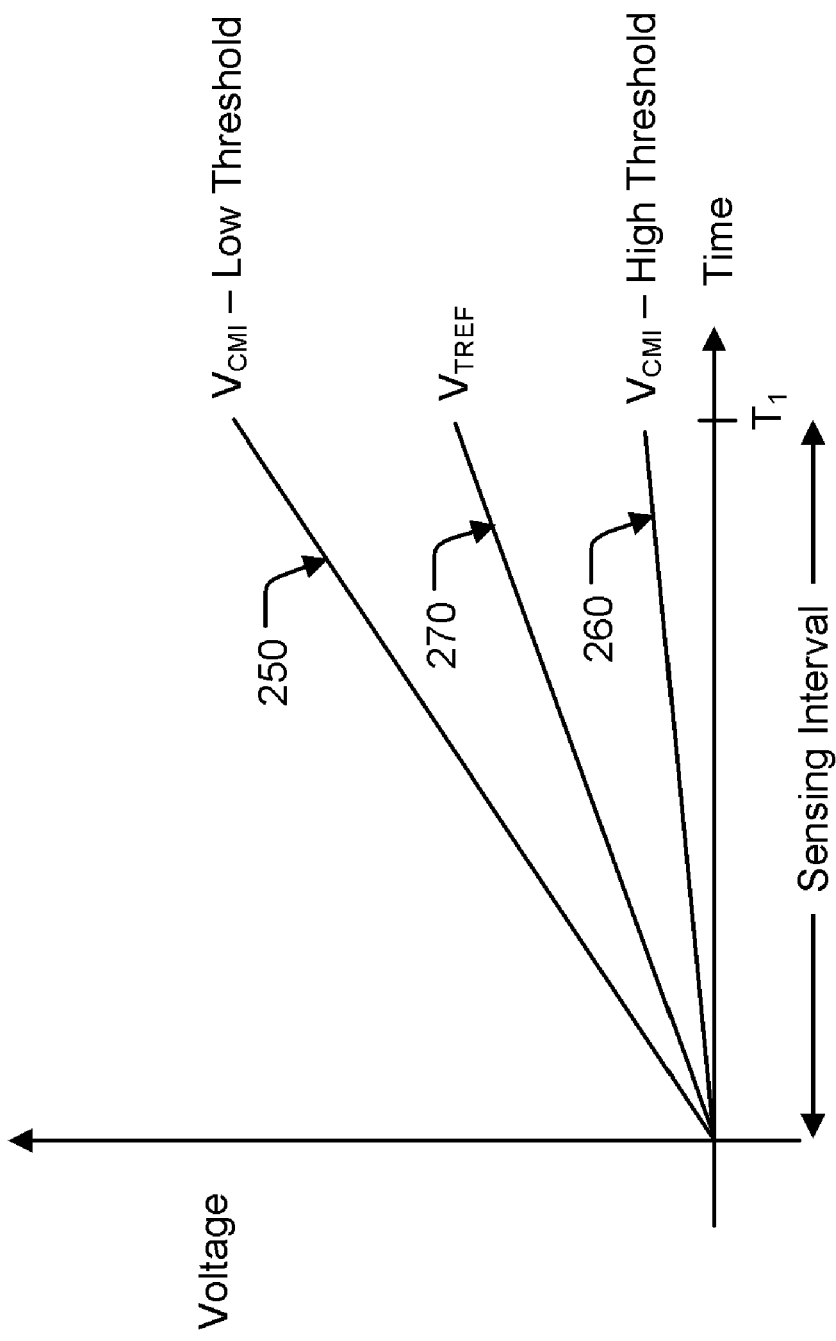
FIG. 2 is a simplified illustration of the change in voltage at the sensing input of the sense amplifier versus time.
Figure 3:
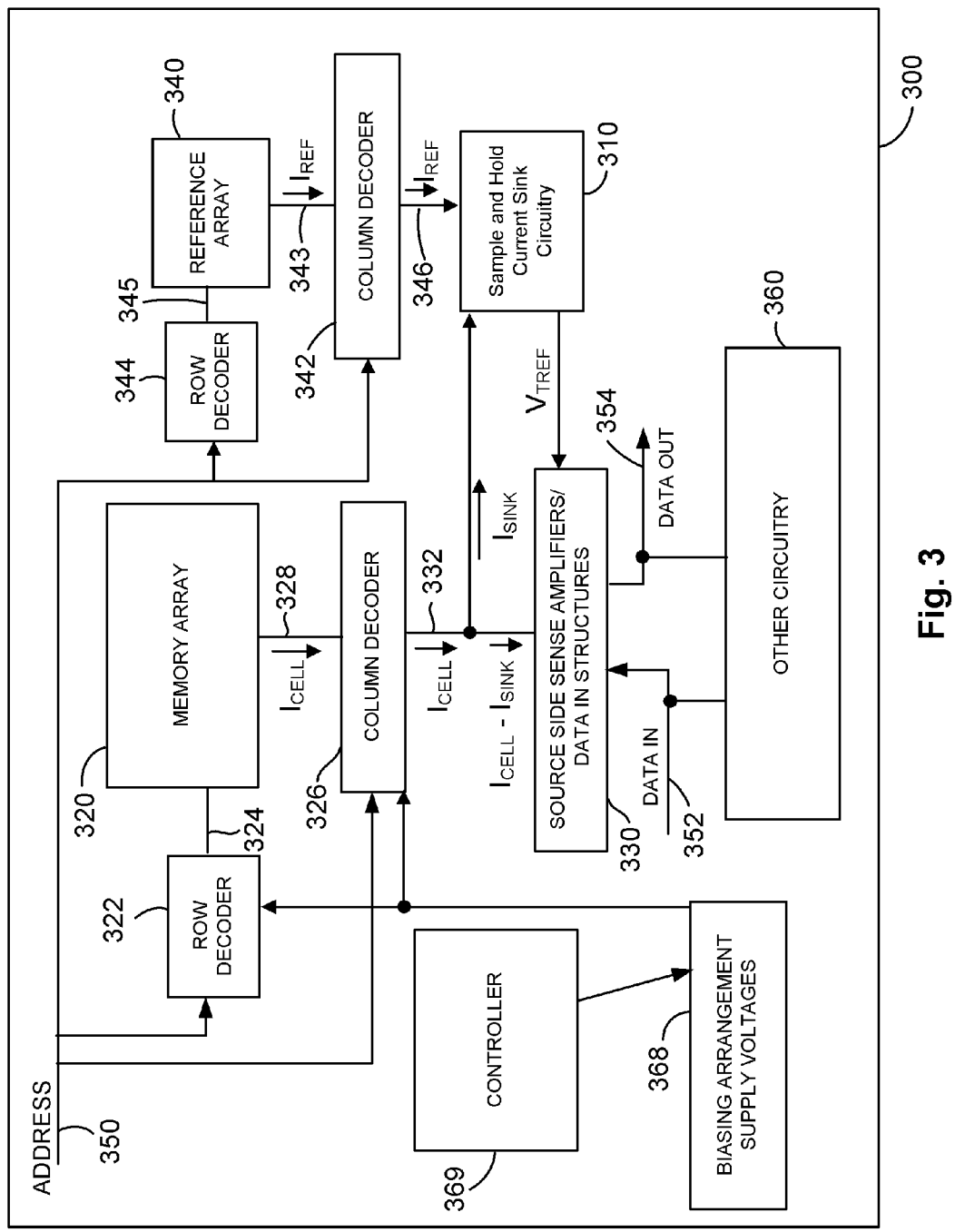
FIG. 3 is a simplified block diagram of an integrated circuit device including sample and hold current sink circuitry for implementing source-side sensing techniques described herein.

FIG. 3 is a simplified block diagram of an integrated circuit 300 including sample and hold current sink circuitry 310 which can be used to sense the data value stored in the memory cells in memory array 320 as described herein.

A row decoder 322 is coupled to a plurality of word lines 324 arranged along rows in the memory array 320. A column decoder 326 is coupled to a plurality of bit lines 328 arranged along columns in the memory array 320 for sensing, programming, and erasing the memory cells in the array 320. The memory cells of the array 320 may for example be arranged in series, in parallel, or in a virtual ground array. Sense amplifiers and data-in structures in block 330 are coupled to the column decoder 326 in this example via data line 332.

As described in more detail below, in a sensing operation of a selected memory cell in the memory array 320, appropriate voltages are applied to induce a read current $I_{CELL}$ from the source terminal of the selected memory cell in the array 320 to the data line 332. The sample and hold current sink circuitry 310 is coupled to the data line 332 to draw a sink current $I_{SINK}$ in response to a magnitude of an operating voltage between first and second nodes. As used herein, the term "operating voltage" refers to a voltage between first and second nodes of the sample and hold current sink circuitry 310 having a magnitude established in response to the magnitude of the reference current $I_{REF}$, and which, if changed, alters the magnitude of the sink current $I_{SINK}$.

The sample and hold current sink circuitry 310, discussed below, includes a feedback path operable to set the operating voltage between the first and second nodes in response to the magnitude of the reference current $I_{REF}$. During a first time interval ("sample interval") of the sensing operation, the feedback path is enabled to quickly set the operating voltage. During a second time interval ("hold interval"), the feedback path is disabled, and a hold capacitor coupled between the first and second nodes holds the operating voltage essentially constant and thus essentially noise free.

In embodiments described herein, the operating voltage is the voltage between the control terminal (e.g. a gate terminal) and a conduction terminal (e.g. a source or drain terminal) of a load transistor in the sample and hold current sink circuitry 310 drawing the sink current $I_{SINK}$ and the reference current $I_{REF}$. The hold capacitor is used to apply an essentially constant control-to-conduction terminal voltage (e.g. gate-to-source voltage) to the load transistor, so that the current in the load transistor remains essentially constant during the holding time interval.

The difference between the read current $I_{CELL}$ and the sink current $I_{SINK}$ is provided to sense amplifier circuitry of block 330. The sense amplifier circuitry is responsive to a difference in current between the read current $I_{CELL}$ and the sink current $I_{SINK}$ during the second time interval to generate an output signal indicating a data value stored in the selected memory cell.

As shown in FIG. 3, the sample and hold current sink circuitry 310 also provides a reference voltage $V_{TREF}$ to reference nodes of the sense amplifier circuitry of block 330 during the sensing operation.

In FIG. 3, a reference current $I_{REF}$ is provided to the sample and hold current sink circuitry 310 by a reference cell in a reference array 340. Other techniques for providing the reference current $I_{REF}$ can alternatively be used. For example, the reference current $I_{REF}$ can be based on the reference currents in more than one reference cell.

Row decoder 344 is coupled to word lines 345 arranged along rows in the reference array 340. Column decoder 342 is coupled to bit lines 343 arranged along columns in the reference array 340. In the illustrated embodiment the reference array 340 is shown separate from the memory array 320, and includes separate row and column decoders 344, 342. Alternatively, the reference array 340 may be implemented as part of the memory array 320, with shared decoders.

Addresses are supplied on bus 350 to column decoders 326, 342 and row decoders 322, 344. Data is supplied via the data-in line 352 from input/output ports on the integrated circuit 300, to the data-in structures in block 330. In the illustrated embodiment, other circuitry 360 is included on the integrated circuit 300, such as a general purpose processor or special purpose application circuitry, or a combination of modules providing system-on-a-chip functionality. Data is supplied via data-out line 354 from the sense amplifiers of block 330 to input/output ports on the integrated circuit 300, or to other data destinations internal or external to the integrated circuit 300.

The integrated circuit 300 includes a controller 369 for sensing, programming, and erasing the memory cells in the memory array 320 and the reference cells in the reference array 340. The controller 369, implemented in this example using a bias arrangement state machine, controls the application of bias arrangement supply voltages generated or provided through the voltage supply or supplies in block 368, such as read, program and erase voltages. The controller 369 can be implemented using special-purpose logic circuitry as known in the art. In alternative embodiments, the controller 369 comprises a general-purpose processor, which may be implemented on the same integrated circuit, which executes a computer program to control the operations of the integrated circuit 300. In yet other embodiments, a combination of general-purpose processor may be utilized for implementation of the controller 369.

Figure 4:
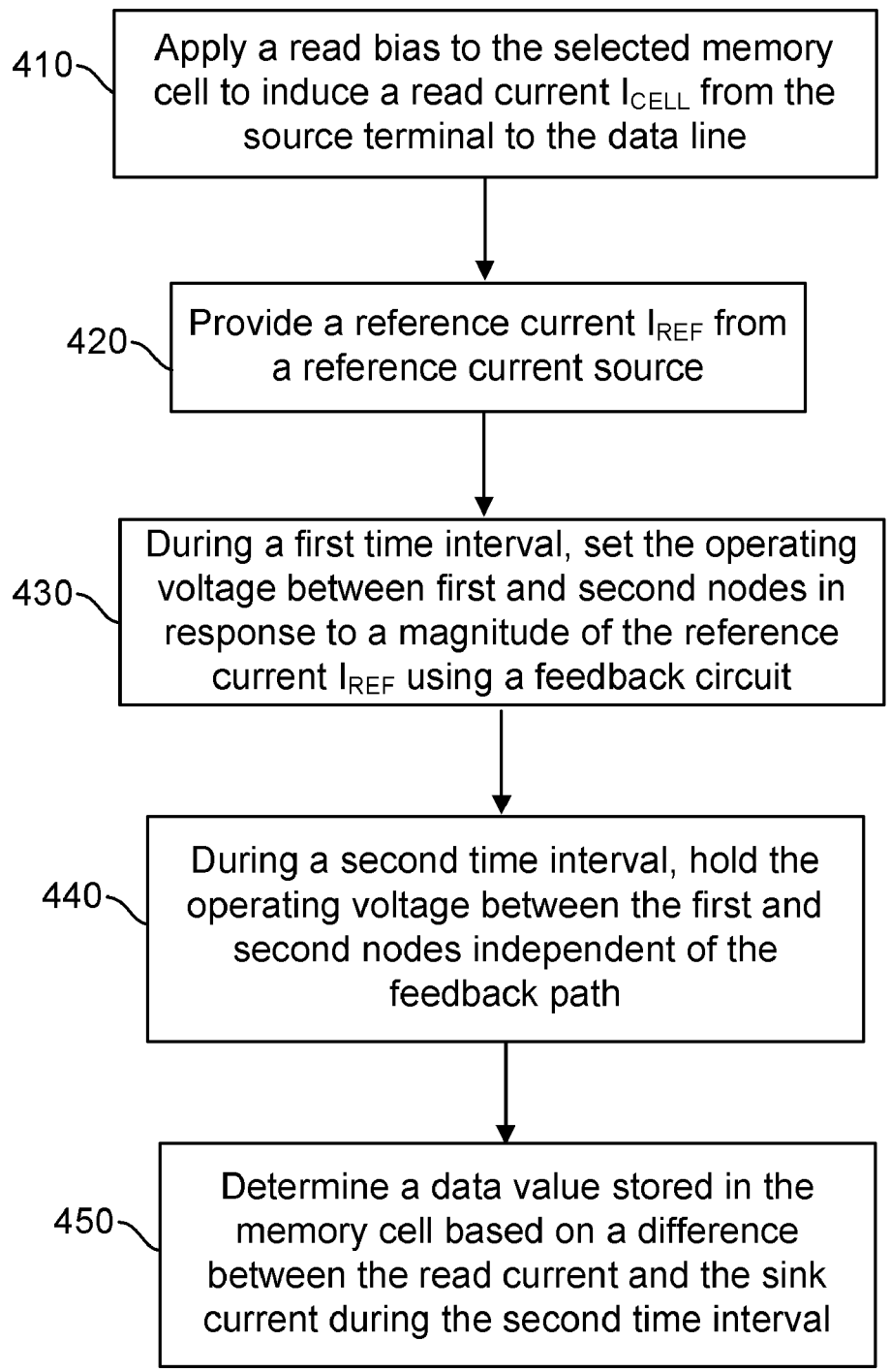
FIG. 4 illustrates a flow diagram of a source-side sensing method for reading the data value stored in the selected memory cell.

FIG. 4 illustrates a flow diagram of a sensing operation 400 of a selected memory cell in the memory array 320 which can be executed by the controller 369.

At block 410, a read bias is applied to the selected memory cell to induce a read current $I_{CELL}$ from the source terminal of the selected memory cell in the array 320 to the data line 332.

At block 420, reference current $I_{REF}$ is provided from a reference current source. In the illustrated embodiment of FIG. 3, the reference current $I_{REF}$ is provided by applying appropriate bias voltages to the reference cell in the reference array 340.

As described above, the sink current $I_{SINK}$ is drawn from the data line 332 in response to a magnitude of an operating voltage between the first and second nodes of the sample and hold current sink circuitry 310 (blocks 430, 440). During a first time interval (block 430), the operating voltage between the first and second nodes is set in response to a magnitude of the reference current $I_{REF}$ using a feedback path in the sample and hold current sink circuitry 310. As described in more detail below, the feedback path is used to quickly set the operating point for the sample and hold current sink circuitry, including quickly setting the operating voltage between the first and second nodes.

During a second time interval (block 440) following the first time interval, the operating voltage is held between the first and second nodes independent of the feedback path.

At block 450, the data value stored in the memory cell is determined based on a difference between the read current and the sink current during the second time interval.

Figure 5:
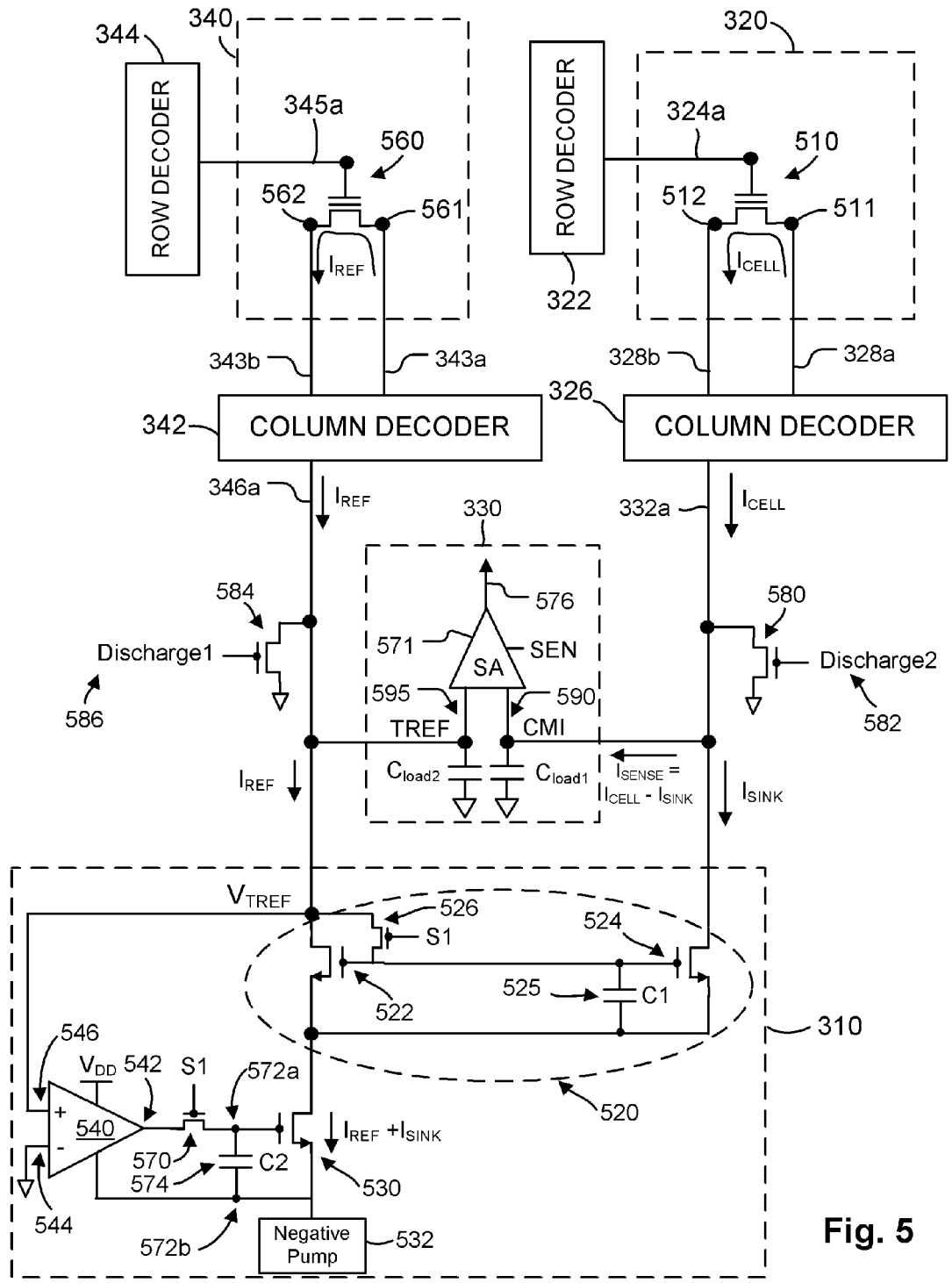
FIG. 5 is a schematic diagram of a first embodiment of the sample and hold current sink circuitry.

FIG. 5 is a schematic diagram of a first embodiment of the sample and hold current sink circuitry 310 used for sensing a data value stored in a selected memory cell 510 in the memory array 320.

Word line 324a is coupled to the gate terminal of the memory cell 510. Bit lines 328a, 328b are coupled to the drain and source terminals 511, 512 of the memory cell 510.

In a sense operation of the memory cell 510, appropriate voltages are applied to word line 324a and bit line 328a to induce a read current $I_{CELL}$ from the drain 511 to the source 512 and onto the bit line 328b. The read current $I_{CELL}$ is provided to the data line 332a via column decoder 326.

In the illustrated example, reference cell 560 of the reference array 340 is used to provide the reference current $I_{REF}$. Word line 345a is coupled to the gate terminal of the reference cell 560. Bit lines 343a and 343b are coupled to the drain terminal 561 and source terminal 562 of the reference cell 560.

Voltages are applied to the word line 345a and bit line 343a to induce the reference current $I_{REF}$ from the drain terminal 561 to the source terminal 562 and onto the bit line 343b. The reference current is provided to the reference line 346a via the column decoder 342.

The sample and hold current sink circuitry 310 includes transistor 522 having a drain terminal coupled to the reference line 346a to receive the reference current $I_{REF}$. The gate terminal of the transistor 522 is selectively coupled to the reference line 346a by switch 526. The switch 526 is implemented in this example using a single pass transistor having a gate coupled to control signal S1. Alternative techniques for implementing the switch 526 can also be used. For example, the switch 526 may be implemented using a pair of complimentary pass transistors having parallel conduction paths and supplied with complimentary gate control signals.

When switch 526 is closed the transistor 522 is diode-connected to form a current mirror 520 with transistor 524, which establishes the operating point for the current mirror 520. Transistor 524 has a drain terminal coupled to the data line 332a to draw the sink current $I_{SINK}$ having a magnitude that is a function of the magnitude of the reference current $I_{REF}$. For example, the magnitude of the sink current $I_{SINK}$ may be substantially the same as that of the reference current $I_{REF}$.

In the illustrated example the current mirror 520 is implemented using transistors 522 and 524. Alternative techniques for implementing the current mirror 520 may also be used.

Hold capacitor C1 525 is coupled between the gate terminals and the source terminals of the transistors 522, 524. When the switch 526 is open, the bias voltage established on the gate terminals of the transistors 522, 524 is held by the hold capacitor C1 525. The size of the hold capacitor C1 525 is sufficient to hold the bias voltage between the gate terminals and the source terminals of the transistors 522, 524 during the hold interval of the sensing operation, so that the transistors 522, 524 remain on and the difference, if any, between the sink current $I_{SINK}$ and the reference current $I_{REF}$ remains essentially constant during the hold interval.

It will be understood that the bias voltage held between the gate terminals and the source terminals of the transistors 522, 524 by the hold capacitor C1 may change during the holding time interval due to charge leakage, as well as due to the noise at the instant the switch 526 is opened.

A load transistor 530 has a drain terminal coupled to the source terminals of the transistors 522, 524. The load transistor 530 has a source terminal coupled to a negative pump circuit 532 which supplies a negative bias voltage.

The current through the load transistor 530 is the combination of the reference current $I_{REF}$ in transistor 522 and the sink current $I_{SINK}$ in transistor 524. The current through load transistor 530 is converted to a voltage at the source terminals of the transistors 522, 524 by the load transistor 530.

The sample and hold current sink circuitry 310 also includes an operational amplifier 540. Supply voltage $V_{DD}$ and negative pump circuitry 532 provide bias voltages to the operational amplifier 540. The operational amplifier 540 has a negative input 544 coupled to ground in this example. The operational amplifier 540 has a positive input 546 coupled to the reference line 346a. Because of the virtual ground effect between the two inputs 544 and 546, the voltage $V_{TREF}$ on the reference line 346a is biased approximately to ground by the operational amplifier 540. The term "approximately" is intended to accommodate a voltage difference between the inputs 544, 546 due to a non-zero input offset voltage in the operational amplifier 540.

The output 542 of the operational amplifier 540 is selectively coupled by a switch 570 to node 572a connected to the gate of the load transistor 530. The switch 570 is implemented in this example using a single pass transistor having a gate coupled to control signal 51. Alternative techniques for implementing the switch 526 can also be used. For example, the switch 570 may be implemented using a pair of complimentary pass transistors having parallel conduction paths and supplied with complimentary gate control signals.

Closing the switch 570 establishes a negative feedback path from the output 542 to the positive input 546 of the operational amplifier 540. When the switch 570 is closed, the voltage provided by the output 542 of the operational amplifier 540 is applied to the gate of the load transistor, which quickly sets the operating voltage between the nodes 572a, 572b during a sample interval of the sensing operation.

The negative feedback path can be explained as follows. An increase in the voltage at the positive input 546 of the operational amplifier 540 will cause an increase in the voltage at the output 542, and thus increase the voltage on the gate of the load transistor 530. This will result in an increase in the gate to source voltage of the load transistor 530, causing a decrease in the drain voltage of the load transistor 530, and consequently a decrease in the source voltage of the transistors 522, 524. This will result in a decrease in the drain voltage of the transistor 522, which decreases the gate voltage of transistors 522, 524 due to the connection via switch 526. This will result in a decrease in the voltage at the positive input 546 of the operational amplifier, as the drain of transistor 522 is connected to the positive input 546. This is opposite in direction to the change in the voltage at the positive input 546 originally assumed. Hence the feedback is negative.

Hold capacitor C2 574 is coupled between the gate terminal and the second conduction terminal of the load transistor 530. When the switch 570 is open, the feedback path is disabled and the output 542 is disconnected from the node 572a. The operating voltage established between the nodes 572a and 572b and thus the gate to source voltage of the load transistor 530 is held by the hold capacitor C2 574. Opening the switch 570 prevents noise present at the output 542 of the operational amplifier 540 from changing the voltage on the node 572a during the hold interval.

The size of the hold capacitor C2 574 is sufficient to hold the operating voltage between nodes 572a, 572b during the hold interval. The hold capacitor C2 574 applies an essentially constant gate to source voltage to the load transistor 530, so that the current in the load transistor 530 remains essentially constant during the hold interval. It will be understood that the operating voltage held between nodes 572a, 572b and thus the current in the load transistor 530 may change by an incremental value during the holding time interval due to charge leakage, as well as due to the noise at the instant the switch 570 is opened.

Sense amplifier 571 of block 330 has a reference input or node 595 coupled to the reference line 346a, and has a sensing input or node 590 coupled to the data line 332a. As described above, the voltage on reference line 346a and thus the voltage on the reference input 595 is biased at $V_{TREF}$ by the operational amplifier 540, which is ground in this example.

Sensing current $I_{SENSE}$, the difference between the read current $I_{CELL}$ and the sink current $I_{SINK}$, is provided to the sensing input 590 of the sense amplifier 571. The sensing current $I_{SENSE}$ is converted to a voltage on the sensing input 590 by charging equivalent load capacitor $C_{LOAD1}$ during the hold interval. The sense amplifier 571 is responsive to the difference between the voltages on the sensing input 590 and the reference input 595 to generate an output signal 576 indicating the data value stored in the memory cell 510, triggered by sense enable signal SEN.

Discharge transistor 580 is coupled to the data line 332a. The gate of the discharge transistor 580 is coupled to a Discharge2 signal 582 used to couple the data line 332a and thus the sensing input 590 to ground. Alternatively, a bias voltage other than ground can be used.

Discharge transistor 584 is coupled to the reference line 346a. The gate of the discharge transistor 584 is coupled to a Discharge1 signal 586 used to couple the reference line 346a and thus the reference input 595 to ground. Alternatively, a bias voltage other than ground can be used.

Figure 6:
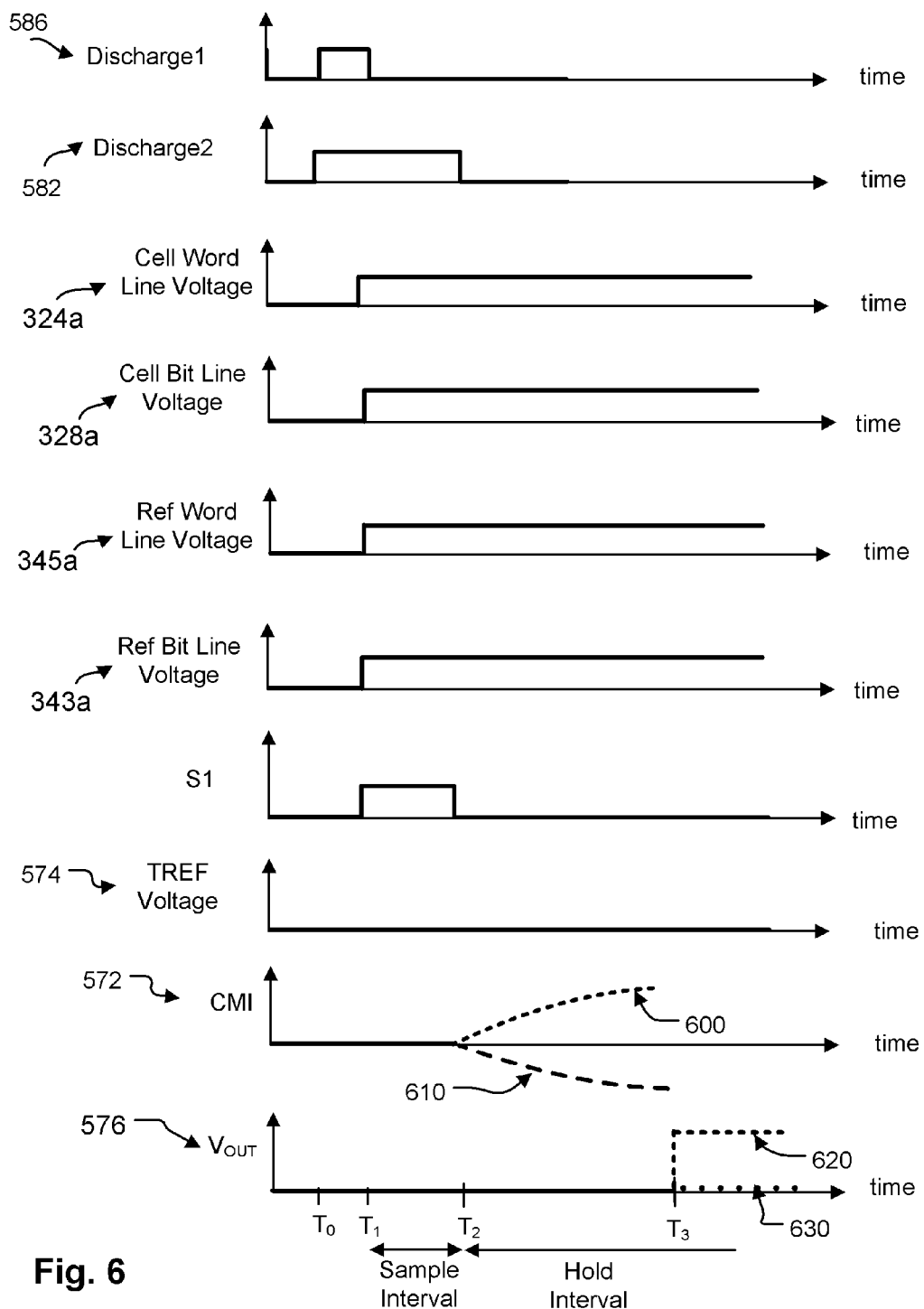
FIG. 6 illustrates a timing diagram for operating the sample and hold current sink circuitry of FIG. 5.

FIG. 6 illustrates a timing diagram for operating the sample and hold current sink circuitry 310 of FIG. 5 to sense the data value stored in the selected memory cell 510. It will be understood that the timing diagram of FIG. 6 is simplified and not necessarily to scale.

At time T0, signal Discharge1 586 is asserted to turn on the discharge transistor 584 and couple the reference line 346a and thus the reference input 595 to ground. Signal Discharge2 582 is asserted to turn on the discharge transistor 580 and couple the data line 332a and thus the sensing input 590 to ground.

At time T1, row decoder 322 is responsive to address signals to apply a read voltage $V_{WL-READ}$ to word line 324a coupled to the gate of the selected memory cell 510. Column decoder 326 is responsive to the address signals to apply a read voltage $V_{BL-READ}$ to bit line 328a coupled to the drain terminal 511 of the selected memory cell 510, and to couple the bit line 328b to data line 332a. The read voltages applied to the word line 324a and bit line 328a induce a read current $I_{CELL}$ from the drain terminal 511 to the source terminal 512, onto the bit line 328b, and onto the data line 332a.

As can be seen in FIG. 6, the signal Discharge2 582 remains asserted so that the discharge transistor 580 remains on, and the data line 332a and sensing input 590 remain coupled to ground during the sample interval between time $T_1$ and $T_2$.

Row decoder 344 is responsive to address signals to apply voltage $V_{WL-REF}$ to word line 345a coupled to the gate of the reference cell 560. Column decoder 342 is responsive to address signals to apply voltage $V_{BL-REF}$ to bit line 343a coupled to the drain terminal 561 of the reference cell 560, and to couple bit line 343b to reference line 346a. The voltages applied to the word line 345a and bit line 343a induce the reference current $I_{REF}$ from the drain terminal 561 to the source terminal 562, to the bit line 343b, and onto the reference line 346a.

Signal Discharge1 586 turns off the discharge transistor 584, and control signal 51 is asserted to close the switches 526 and 570. This establishes the operating point for the sample and hold current sink circuitry 310, including setting the operating voltage between nodes 572a, 572b.

The closing of switch 526 diode-connects the transistor 522 of the current mirror 520 coupled to the reference line 346a to receive the reference current $I_{REF}$. Transistor 524 of the current mirror 520 draws the sink current $I_{SINK}$ from the data line 332a in response to the magnitude of the reference current $I_{REF}$ in transistor 522.

Closing the switch 570 establishes the negative feedback path from the output 542 to the positive input 546 of the operational amplifier 540. The voltage provided by the output 542 of the operational amplifier 540 is applied to the node 572a to set the operating voltage between nodes 572a, 572b connected between the gate terminal and the source terminal of the load transistor 530.

The feedback loop of the operational amplifier 540 operates by amplifying the difference between the voltages on the positive input 546 and the negative input 544, and forcing the voltage on the positive input 546 to be approximately equal to the voltage on the negative input 544 by minimizing this difference. This allows the operating point for the sample and hold current sink circuitry 310 to be established quickly.

In addition to diode-connecting the transistor 522, closing the switch 526 reduces the closed loop response time of the feedback path by providing a direct path from the gate to the drain terminal of the transistor 522. Also, the capacitor C1 525 provides a feed-forward path for AC signals between the gate terminals to the second conductions terminals of transistors 522 and 524, which also reduces the closed loop response time of the feedback path.

The switch 570 and capacitors C1 525 and C2 574 also provide stability of the feedback path of the operational amplifier 540. The stability of the feedback path is related to the location of poles of the transfer function from the output 542 to the positive input 546. In FIG. 5 the feedback path includes three poles which can make it relatively easy to become unstable, a dominant pole at the output 542 of the operational amplifier 540, and poles due to the capacitor C1 525 and the switch 526, the transistor 522 and the load capacitor 530. The pole at the output 542 is dominant because of its relatively large RC constant due to the large output resistance of the operational amplifier 540, and the relatively large equivalent capacitance due to the gate capacitance of load transistor 530 and the capacitor C2 574. The capacitor C1 525 and switch 526 provide a feed forward path from the source to the drain of transistor 522 for ac signals, so that the equivalent drain to source resistance of transistor 522 is relatively small. As a result, the poles due the capacitor C1 525 and the switch 526 and the transistor 522 are far away from the dominant pole and the second pole due to the load transistor 530, which improves closed loop stability.

In this manner, a stable, high speed operating point for the sample and hold current sink circuitry 310 is achieved during the sample interval from time T1 to time T2.

Once the operating point of the sample and hold current sink circuitry 310 is established using the feedback path, at time T2 the control signal S1 opens the switches 526 and 570 and signal Discharge2 582 turns off the discharge transistor 580.

Opening the switch 526 disconnects the gate terminals of the transistors 522, 524 from the drain terminal of the transistor 526. The hold capacitor C1 525 holds the bias voltage on the gate terminals of the transistors 522, 524 to provide essentially constant gate-to-source biases to transistors 522 and 524, so that the transistors 522, 524 remain on during the hold interval following time T2. It will be understood that the bias voltage held by the hold capacitor C1 may change during the holding time interval due to charge leakage, as well as due to the noise at the instant the switch 526 is opened.

Opening the switch 570 disconnects the output 542 from the control node 572a which disables the feedback path, and also prevents noise present at the output 542 from changing the voltage on the node 572a. The operating voltage between nodes 572a and 572b is held by the hold capacitor C2 574. The hold capacitor C2 574 applies an essentially constant gate to source voltage to the load transistor 530, so that the current in the load transistor 530 remains essentially constant during the holding time interval. It will be understood that the operating voltage held on control node 572a, and thus the current in the load transistor 530, may change by an incremental value during the holding time interval due to charge leakage, as well as due to the noise at the instant the switch 570 is opened.

Sensing current $I_{SENSE}$, the difference between the read current $I_{CELL}$ and the sink current $I_{SINK}$, is provided to the sensing input 590 of the sense amplifier 571.

The sensing current $I_{SENSE}$ is converted to a voltage on the sensing input 590 by charging an equivalent load capacitor $C_{LOAD1}$. The voltage on the sensing input 590 is along curve 600 if the selected memory cell 510 is in the lower threshold state, and is along curve 610 if the selected memory cell is in the higher threshold state.

At time T3, the sense amplifier 571 generates an output signal $V_{OUT}$ indicating the data value stored in the memory cell 510 in response to the difference between the voltage on the sensing input 590 and the voltage on the reference input 595. In FIG. 6, $V_{OUT}$ is a first voltage 620 if the selected memory cell 510 is in the lower threshold state, and is a second voltage 630 if the selected memory cell 510 is in the higher threshold state.

Noise present at the negative pump circuit 532 will have substantially no effect on the comparison between the voltage on the sensing input 590 and the voltage on the reference input 595 because of the common-mode structure provided by the sample and hold current sink circuitry 310. Any noise injected by the negative pump circuit 532 will cause similar changes in current in both the reference cell 560 and the memory cell 510, so that any difference between the cell current $I_{CELL}$ and the reference current $I_{REF}$ remains essentially unaffected during the hold interval. In addition, since the capacitors C1 525 and C2 574 apply an essentially constant gate to source voltages to the transistors 522, 524 and 530, any noise injected into the sources will cause similar changes in the gate voltages, so that the gate to source voltages of the transistors 522, 524 and 530 remains essentially constant, and the fluctuation in the drain voltages is small. Accordingly, the accuracy of the comparison is substantially unaffected by the presence of noise.

Since the voltage on the sensing input 590 of the sense amplifier 571 depends upon the difference between the read current $I_{CELL}$ and the sink current $I_{SINK}$, rather than the entire read current $I_{CELL}$, the variation in voltage at the source terminal 512 is reduced. This in turn reduces the variation in the read current $I_{CELL}$ among cells in the array 320 during source-side sensing. As a result, the distribution in voltage at the sensing input 590 will be tightened.

Additionally, using the sample and hold current sink circuitry 310 to bias the reference input 595, rather than using the reference current $I_{REF}$ to charge the equivalent load capacitor $C_{LOAD2}$, allows higher speed operation. When using the reference current $I_{REF}$ to charge the reference input 595, the time required to reach a reference voltage correlates with the threshold voltage of the reference cell. Thus, the sensing operation must be performed after a specified time in which the reference node should have obtained the reference voltage value. By using the sample and hold current sink circuitry 310 to bias the reference node, the time required to reach the reference voltage is faster than would be required using the reference current $I_{REF}$ to charge the reference input 595.

Figure 7:
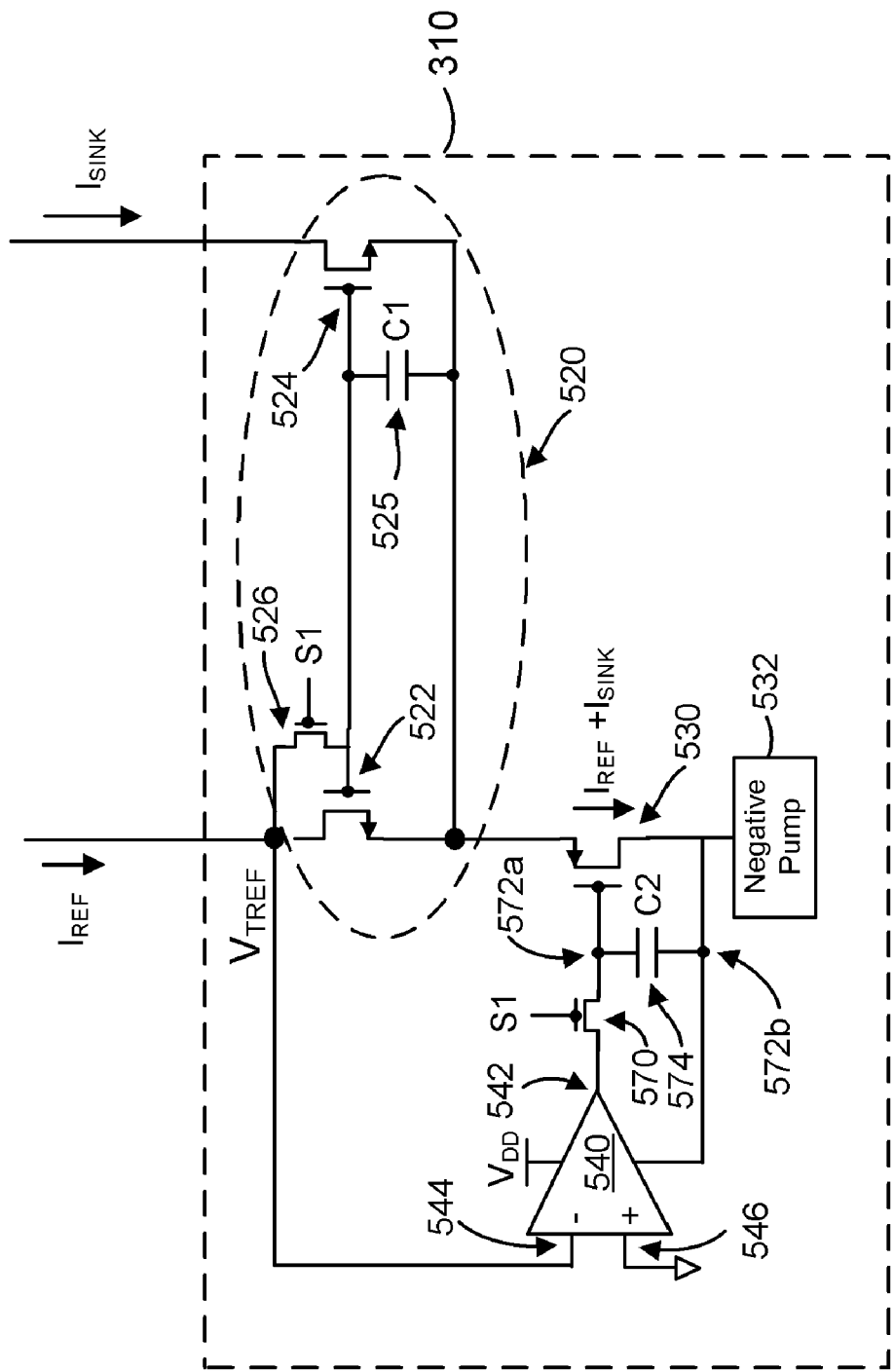
FIG. 7 is a schematic diagram of a second embodiment of the sample and hold current sink circuitry.

FIG. 7 is a schematic diagram of a second embodiment of the sample and hold current sink circuitry 310. In FIG. 7, the load transistor 530 is implemented as a PMOS transistor. The positive input 546 of the operational amplifier 540 is coupled to ground, and the negative input 544 is coupled to the reference line 346a so that a negative feedback path can be established between the output 542 and the negative input 544.

Figure 8:
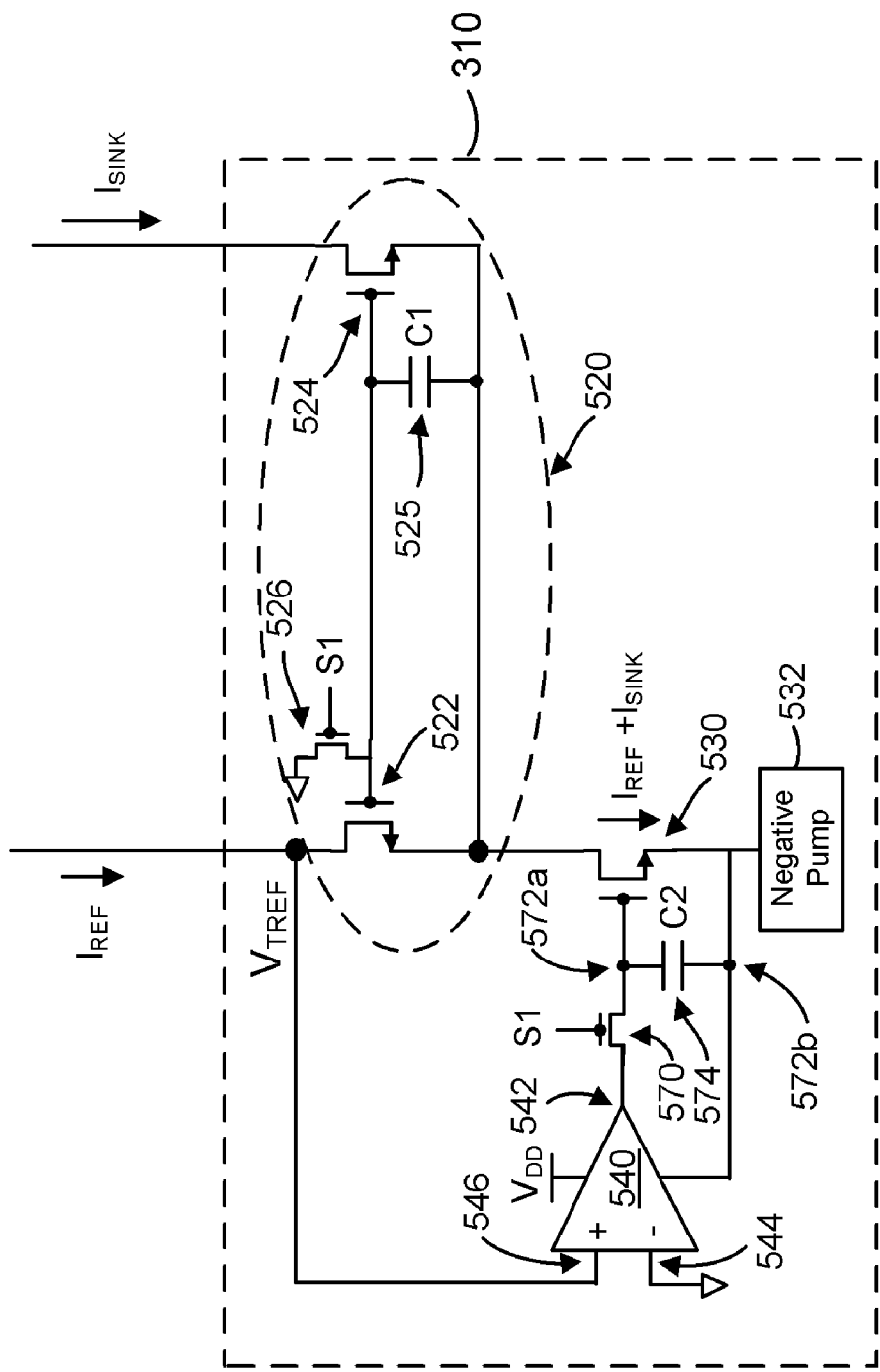
FIG. 8 is a schematic diagram of a third embodiment of the sample and hold current sink circuitry.

FIG. 8 is a schematic diagram of a third embodiment of the sample and hold current sink circuitry 310. In FIG. 8, the gate terminal of the transistor 522 is selectively coupled to ground by switch 526. Using the switch 526 coupled to ground rather than the input 546 of the operational amplifier 540 can improve the closed loop response time by reducing the capacitance coupled to the reference line 346a.

Figure 9:
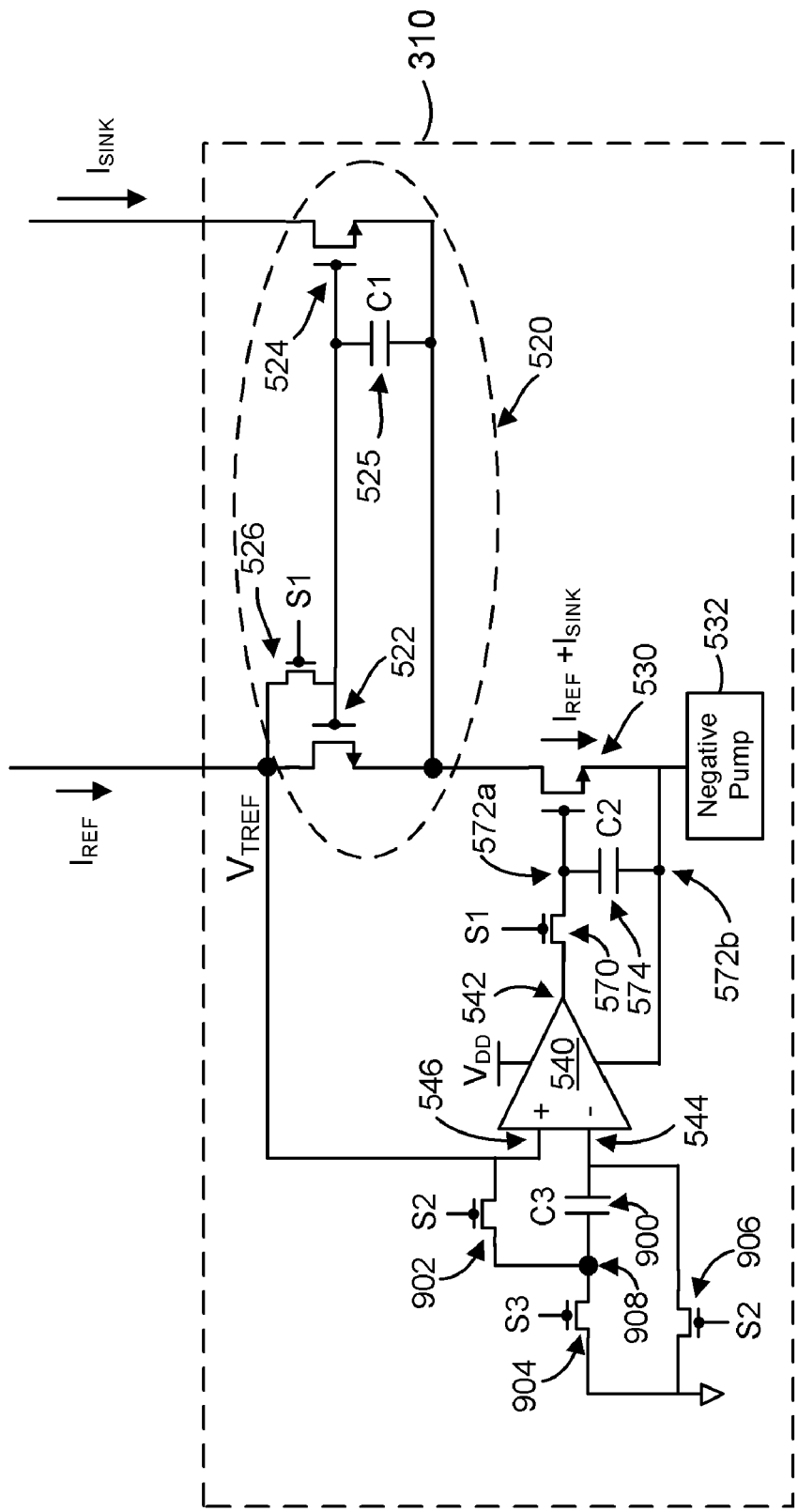
FIG. 9 is a schematic diagram of a fourth embodiment of the sample and hold current sink circuitry.

FIG. 9 is a schematic diagram of a fourth embodiment of the sample and hold current sink circuitry 310 which includes a switch circuit to cancel the dc offset of the operational amplifier 540 to set the voltages at the inputs 546 and 544 equal to one another. Prior to performing the sensing operation, switches 902 and 906 are turned on by asserting signal S2. As a result, the negative input 544 is coupled to ground and the positive input 546 is coupled to node 908, which sets a voltage across the capacitor C3 900 equal to the offset between the inputs 546, 544. The switches 902 and 906 are then turned off, and switch 904 is turned on. This couples node 908 to ground, which provides an equalization path via the capacitor C3, thereby setting the voltage at the input 544 equal to the voltage at the input 546.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device comprising:
a memory array having a data line and a reference current line;
current sink circuitry including a capacitor selectively coupled to the reference current line through a switch; and
sense amplifier circuitry coupled to the data line and the reference current line.

2. The memory device of claim 1, wherein the current sink circuitry further includes a second capacitor selectively coupled to the reference current line through a second switch.

3. The memory device of claim 1, further comprising a reference current source arranged to provide a reference current to the reference current line, and wherein:
the memory array arranged to provide a read current from a selected memory cell in the array to the data line;
the current sink circuitry arranged to draw a sink current from the data line in response to a magnitude of an operating voltage between first and second nodes, the current sink circuitry including a feedback path operable to set the operating voltage between the first and second nodes in response to a magnitude of the reference current, said capacitor coupled between the first and second nodes for holding the operating voltage, and said switch operable to enable the feedback path during a first time interval, and to disable the feedback path during a second time interval following the first time interval; and the sense amplifier circuitry responsive to a difference in current between the read current and the sink current during the second time interval to generate an output signal indicating a data value stored in the selected memory cell.

4. The memory device of claim 3, wherein the sense amplifier circuitry includes a reference node, the sense amplifier circuitry responsive to a difference between voltage or current on the reference node and voltage or current on the sensing node during the second time interval to generate the output signal.

5. The memory device of claim 3, wherein the current sink circuitry includes:
 a current mirror coupled to the data line and to the reference current source, the current mirror arranged to receive the reference current from the reference current source, and arranged to draw the sink current from the data line in response to the magnitude of the reference current;
 a load transistor having first and second conduction terminals and a control terminal, the first conduction terminal coupled to the current mirror and arranged receive the reference current and the sink current from the current mirror, wherein the capacitor is coupled between the control terminal and the second conduction terminal to hold the operating voltage on the load transistor during the second time interval;
 an operational amplifier having a first input coupled to a bias voltage, a second input coupled to the reference current source, and having an output selectively coupled to the control terminal of the load transistor via the switch.

6. The memory device of claim 5, wherein:
 the current mirror includes first and second transistors each having a control terminal and first and second conduction terminals, the control terminal of the first transistor coupled to the control terminal of the second transistor, the first conduction terminal of the first transistor coupled to the reference current source, the first conduction terminal of the second transistor coupled to the data line, and the second conduction terminal of the first transistor is coupled to the second conduction terminal of the second transistor;
 the first conduction terminal of the load transistor is coupled to the second conduction terminals of the first and second transistors; and
 the current sink circuitry further includes a second capacitor coupled between the control terminals of the first and second transistors and the second conduction terminals of the first and second transistors.

7. The memory device of claim 5, wherein the current sink circuitry further includes a second switch operable to couple the control terminals of the first and second transistors to a second bias voltage during the first time interval, and to decouple the control terminals of the first and second transistors from the second bias voltage during the second time interval.

8. The memory device of claim 7, wherein the control terminals of the first and second transistors are selectively coupled to the second input of the operational amplifier via the second switch.

9. The memory device of claim 5, further comprising a switch circuit operable to set voltages on the first and second inputs of the operational amplifier equal to one another before the first time interval.

10. The memory device of claim 3, further comprising a discharge transistor operable to couple the data line to a bias voltage during the first time interval, and to decouple the data line from the bias voltage during the second time interval.

11. The memory device of claim 3, wherein the reference current source comprises a reference cell.

12. A sensing method for a memory cell, the method comprising:
 applying a bias to the memory cell to induce a read current from the memory cell to a data line;
 providing a reference current from a reference current source;
 drawing a sink current from the data line in response to a magnitude of an operating voltage between first and second nodes, including:
  setting the operating voltage between the first and second nodes in response to a magnitude of the reference current during a first time interval using a feedback path; and
  holding the operating voltage between the first and second nodes independent of the feedback path during a second time interval following the first time interval; and
 determining a data value stored in the memory cell based on a difference in current between the read current and the sink current during the second time interval.

13. The method of claim 12, further comprising setting a voltage on the sensing node during the second time interval based on the difference in current between the read current and the sink current, and biasing a reference node to a reference voltage, and wherein determining the data value stored in the memory cell comprises determining the data value stored based on a difference between said voltage on the sensing node and the reference voltage on the reference node.

14. The method of claim 13, wherein determining the data value stored in the memory cell further comprises:
 coupling the sensing node to a first input of a sense amplifier;
 coupling the reference node to a second input of the sense amplifier; and
 generating an output signal of the sense amplifier based on a difference between voltages at the first and second inputs, the output signal indicating the data value stored in the memory cell.

15. The method of claim 12, wherein drawing a sink current from the data line includes:
 coupling a current mirror to the data line and to the reference current source, the current mirror arranged to receive the reference current, and arranged to draw the sink current from the data line in response to the magnitude of the reference current;
 coupling a first conduction terminal of a load transistor to the current mirror, the load transistor arranged to receive the reference current and the sink current from the current mirror, wherein a capacitor is coupled between a control terminal and the second conduction terminal of the load transistor to hold the operating voltage on the load transistor during the second time interval; and
 coupling a first input of an operational amplifier to a bias voltage, coupling a second input of the operational amplifier to the reference current source, and selectively coupling an output of the operational amplifier to the control terminal of the load transistor via a switch, the switch responsive to a control signal to couple the output of the operational amplifier to the control terminal during the first time interval, and to decouple the output of the operational amplifier from the control terminal during the second time interval.

16. The method of claim 15, wherein:
the current mirror includes first and second transistors each having a control terminal and first and second conduction terminals, the control terminal of the first transistor coupled to the control terminal of the second transistor, the first conduction terminal of the first transistor coupled to the reference current source, the first conduction terminal of the second transistor coupled to the data line, and the second conduction terminal of the first transistor is coupled to the second conduction terminal of the second transistor, wherein a second capacitor is coupled between the control terminals of the first and second transistors and the second conduction terminals of the first and second transistors; and
the first conduction terminal of the load transistor is coupled to the second conduction terminals of the first and second transistors.

17. The method of claim 16, including selectively coupling the control terminals of the first and second transistors to a second bias voltage via a second switch, the second switch responsive to the control signal to couple the control terminals of the first and second transistors to the second bias voltage during the first time interval, and to decouple the control terminals of the first and second transistors from the second bias voltage during the second time interval.

18. The method of claim 17, wherein the second switch selectively couples the control terminals of the first and second transistors to the second input of the operational amplifier.

19. The method of claim 12, further comprising coupling the data line to a bias voltage during the first time interval, and decoupling the data line from the bias voltage during the second time interval.

20. A memory device comprising:
a memory array arranged to provide a read current from a selected memory cell in the array to a data line;
a reference current source arranged to provide a reference current;
current sink circuitry coupled to the data line, the current sink circuitry arranged to draw a sink current from the data line, the current sink circuitry operable to enable a feedback path to establish the sink current during a first time interval, and to disable the feedback path and hold the sink current during a second time interval following the first time interval; and
sense amplifier circuitry coupled to the data line, the sense amplifier circuitry responsive to a difference in current between the read current and the sink current during the second time interval to generate an output signal indicating a data value stored in the selected memory cell.

* * * * *